United States Patent [19]

Khoury et al.

[11] Patent Number: 4,600,936

[45] Date of Patent: Jul. 15, 1986

[54] CHIP REGISTRATION MECHANISM

[75] Inventors: Henri A. Khoury, Yorktown Heights, N.Y.; Bruce E. Tompkins, Brookfield Center, Conn.

[73] Assignee: International Business Machines Corporation, Armonk, N.Y.

[21] Appl. No.: 513,188

[22] Filed: Jul. 12, 1983

[51] Int. Cl.⁴ ............... H01L 23/42; H01L 23/44; H01L 23/46
[52] U.S. Cl. .................................................... 357/79
[58] Field of Search .............. 357/79; 414/627, 676, 414/755; 406/88; 198/382, 383, 384, 493, 689

[56] References Cited

U.S. PATENT DOCUMENTS

| | | | |
|---|---|---|---|
| 3,717,381 | 2/1973 | Hagler | 406/88 |
| 3,776,394 | 12/1973 | Miller | 214/1 R |
| 3,982,627 | 9/1976 | Isohata | 214/1 Q |
| 4,062,462 | 12/1977 | Hentz et al. | 414/627 |
| 4,242,038 | 12/1980 | Santini et al. | 414/755 |
| 4,395,165 | 7/1983 | DeRobertis et al. | 406/88 |

FOREIGN PATENT DOCUMENTS 0054899  6/1982  European Pat. Off.

OTHER PUBLICATIONS

IBM Technical Disclosure Bulletin vol. 16, No. 9, Feb. 1974, NY, USA, A. Mack et al "Wafer Stop", p. 2906.

*Primary Examiner*—William L. Sikes
*Assistant Examiner*—Robert E. Wise
*Attorney, Agent, or Firm*—Sughrue, Mion, Zinn, Macpeak, and Seas

[57] ABSTRACT

A chip registration mechanism may form a part of a carrier for retaining in position a plurality of integrated circuit chips in row and column fashion having identification codes on one surface thereof, such that the chip codes may be read and cooperate with a tray having multiple cells, with each cell receiving an individual integrated circuit chip, or function to position a single chip relative to a reference surface for processing. A chip registration base member includes a pedestal projecting upwardly from a base member within a cavity having transverse dimensions oversized relative to the chip and defining at least one lateral reference surface. A lid extends across the top of the member partially defines the cavity above the chip with the chip resting on the top of the pedestal. Inclined nozzles carried by the pedestal function to jet air from the pedestal top surface against the bottom of the chip to create an air film to support the chip and to impart a force laterally to move the edge of the chip against the cavity reference surface. A relief channel about the base of the pedestal open to the atmosphere prevents flutter of the chip and insures accurate registration contact of the edge of the chip against the cavity reference surface. The same nozzle carried by the pedestal function to vacuum the bottom of the chip against the pedestal top surface to clamp the chip in this orientation.

4 Claims, 11 Drawing Figures

DIRECTION OF COMPRESSED AIR FLOW (F1)

CHIP REGISTRATION MECHANISM

FIELD OF THE INVENTION

This invention relates to an integrated circuit chip registration mechanism for positioning and accurately registering multiple individual chips having identification codes thereon such that the chip codes may be optically read and to a perforated pedestal for supporting and positioning the chips in a reference cavity relative to one or more reference surfaces defined by the cavity's sidewalls.

BACKGROUND OF THE INVENTION

Traditionally, silicon wafers containing a plurality of integrated circuits have been either manually inscribed or written by laser with serial numbers so that the wafers can be readily tracked during the many required fabrication process steps. When, however, the wafer becomes diced into many integrated circuit chips, the tracking of discrete chips through the final fabrication and inspection steps becomes nearly impossible, especially for bipolar arrays.

In an effort to alleviate this problem, an eight digit serial number has been written by laser on the back side of each bipolar chip, at the corners thereof, thereby restoring chip trackability. Referring to FIGS. 1a and 1b which show, respectively, the front and back sides of a diced integrated circuit or chip indicated generally at 10 which is square in shape and which has each side of a given length A, contains on the front side 12, a plurality of metal contact balls 14. The back side 16 of the chip 10 is provided with an eight digit laser-written serial number comprised of two digits each, as at 18, located at respective corners as shown.

These chips 10 are normally inserted into, transported in, and inspected from a plastic carrier or linear device bank (LDB) as shown in FIGS. 2 and 3. The linear device bank, indicated generally at 20, consists of a platelike tray, indicated generally at 22, which may be formed of plastic, and top cover 24 and bottom cover 26, sandwiching tray 22. The chips 10 are maintained nested within respective cavities, indicated generally at 28, which cavities are of square horizontal cross-section and defined by upper inclined sidewalls 32 and lower vertical sidewalls 30 which join the inclined sidewalls. Each chip 10 nests in a given cavity 28 and each linear device bank is manufactured and sized so as to hold a maximum of 120 chips. The vertically straight sidewalls 30 are of a given length and widthwise dimension C which is greater than the side dimensions A of the chip, thereby providing room for the chip to move within its cavity 28.

To use the linear device bank 20, the plastic tray 22 is oriented as shown in FIG. 3 such that the tapered side walls 32 face upwardly. The bottom cover 26 is slid under the plastic tray 22 and, with the top cover 24 removed, the chips 10 are inserted into the cavities 28, one chip per cavity, such that the contact balls 14 of each chip face upwardly. Lastly, the top cover 24 is slid into place and the linear device bank is complete.

The presence of the bottom and top covers 26 and 24, respectively, prevents the chips 10 from falling out of the linear device bank. As may be appreciated, the contact balls 14 are visible when the top face of the plastic carrier tray 22 is face up. Also the chips 10 are each captured in their respective cavities 28 by the straight sidewalls 30 partially defining those cavities 28.

In order to minimize handling and chance of breakage, chip serial numbers are read while the chips are nested in the linear device bank. In order to make the eight digit serial number visible, the linear device bank must be flipped over, thereby orienting the chips relative to their cavities 28 in the manner shown in FIGS. 4a and 4b. As seen in FIG. 4a, the metal contact balls 14 now rest on the linear device bank top cover 24.

As may be appreciated, for a carrier holding 120 chips, it is difficult to accurately and precisely register the chips 10 in their cavities 28 so that their serial numbers may be read. Reference to FIG. 4b illustrates what happens in an effort to accurately register a chip 10 in its cavity 28 so that its serial number is readable. (In order to successfully read a chip, the chip must be aligned accurately to a known position to within ±0.025 mm in each of two orthogonal axes.) When the chip is oriented as shown in FIG. 4b, the chip must bank against two adjacent tapered sidewalls 32a, 32b. When viewed through the top of the inverted linear device bank with the bottom cover 26 removed, FIG. 4b, and with an appreciation of the location of the straight side walls 30 of tray 22 relative to the tapered sidewalls 32, it can be readily seen that five of the eight digits are partially obscured by the presence of the straight side walls of the tray 22, at each cavity 28.

The requirement that each chip 10 be registered against two adjacent walls 32a, 32b of each cavity 28, is necessary to insure that the reading laser spot can be moved in a known manner to impinge upon each of the eight digits of the chip serial number. If the chip 10 is allowed to float freely within the cavity, i.e. FIG. 4a, since the chip dimension A is less than the cavity dimension C, registration cannot be guaranteed. Such orientation is possible by tilting the linear device bank against two adjacent walls in each cavity as, for instance, by the imposition of mechanical vibrations against the linear device bank. Irrespective of the nature of achieving the precise registration required, several digits of each chip serial number are obscured, preventing a full eight digit serial number from being properly read.

Additionally, when utilizing mechanical vibration or the like to shift a plurality of chips into precise alignment, impact of a chip against one or more of the references surfaces may be result in a rebound effect and, even if precise registration is initially achieved, it may be lost prior to termination of the optical reading step.

It is, therefore, a primary object of the present invention to provide an improved chip registration mechanism which insures the required precise registration of an integrated circuit chip relative to one or more registration surfaces, which eliminates flutter in movement of the chips while the chips are moved into proper and precise registration position, and which maintains such registration during the period of time when said chips are read.

It is a further object of the present invention to provide an improved chip registration mechanism which is employed within existing linear device banks supporting a plurality of chips in line and column fashion and in which all of the chips may be simultaneously moved into and maintained in registered position with respect to one or more registration surfaces of the linear device bank cavites individually housing such chips.

SUMMARY OF THE INVENTION

The pressent invention is directed in part to a carrier for retaining and positioning integrated circuit chips having identification codes on one surface thereof such that the chip code may be read. The carrier comprises a tray having multiple cells with each cell receiving an individual integrated circuit chip and with each cell defining a reference cavity oversized relative to the chip and having at least one reference surface. A chip registration base assembly comprising a support plate extending across the tray and underlying the cells carries a plurality of individual pedestals which project upwardly from the support plate within the cells. The pedestals have a transverse cross-section less than that of the cavity and terminate in a flat top surface underlying and initially supporting a chip. A lid extends across the tray and overlies the cells to retain the chips when the lid, the tray and the chip registration base assembly are combined, in that order, to form a stacked array. Nozzle means carried by the pedestals jet air from the top surface of the pedestals against the bottoms of the chips, supporting the chips on an air film, and imparting a transverse force to each chip to move and edge of each chip against the at least one cavity reference surface.

The same nozzle means are likewise used to hold said chips in said orientation by applying vacuum thereto after said orientation has been achieved.

The chips may be of rectangular plan configuration, with the cavities being rectangular in transverse cross-section and including two right angle straight walls forming coincident reference surfaces. The nozzles are oriented such that air blown through them exerts forces on the bottom of chips, tending to cause two intersecting edges of the rectangular chips to engage two intersecting reference surfaces defined by the straight sidewalls of the cavity and to thereby position one corner of each chip at a corresponding corner of the rectangular cavity.

The chip registration base assembly comprises sidewalls extending downwardly from the support plate and being integral therewith with a bottom cover underlying the support plate, being spaced from the support plate and defining with the support plate and the sidewalls a plenum chamber. The pedestals preferably comprise hollow projections integral with the support plate and being open to the plenum chamber. The pedestals terminate in a horizontal flat top wall underlying the chip and the nozzle means comprise perforations within the pedestal top wall and means supplying air under pressure or vacuum to the plenum chamber. The tray preferably comprises vertically spaced top and bottom walls with the cells comprising intersecting inclined sidewalls and straight sidewalls, in that order, from the tray top wall to the tray bottom wall when the tray is positioned to initially receive the chips, and wherein the transverse dimensions between the cell straight sidewalls are in excess to the transverse dimensions of the chips received thereby. Further, when the lid underlies the tray and the lid and the tray are inverted as an assembly to initially receive the chips and when the chip registration base assembly is initially inverted and placed onto the tray such that the pedestals project into the tray cavities through the tapered sidewall portions of the cells after the chips are positioned within the cavities, and further, when the stacked assembly thus formed is inverted prior to supplying air under pressure to the nozzle means, and with the height of the pedestals being approximately equal to the height of the tapered sidewall portions of the cells, the air jetting against the bottom of the chips causes at least an edge of each chip to be accurately positioned against the at least one reference surface of its cell.

The support plate preferably includes recessed relief channels about the pedestals beneath the tray being open to the space between the pedestals and the tray cell sidewalls and vented to the atmosphere to prevent flutter of each chip relative to the at least one reference surface during air jet application to the bottom of the chip by preventing air flow between the edge of the chip and the at least one reference surface.

After chip orientation has been achieved, and while compressed air is supplied to the plenum chamber, vacuum is concurrently supplied to the same plenum chamber, which causes the chips to contact the pedestals in said orientation. After the chips have been clamped down by the aplication of vacuum to their pedestals in said orientation, the air supply is removed, thereby leaving said chips precisely oriented and clamped (i.e., "chucked") in their respective cavities, at a known position where they may be read.

The invention also has application to a chip registration mechanism for effecting exact registration of an integrated circuit chip relative to a fixed reference surface so that the chip can be processed, and the chip registration mechanism comprises a first member having a vertical axis reference cavity with the cavity having a transverse dimension oversized relative to the chip and defining at least one lateral reference surface. A chip registration base member underlies the first member bearing the reference cavity and includes a pedestal projecting upwardly from the base member within the cavity being sized transversely to be smaller than the cavity and terminating in a flat top surface underlying the chip. A lid extends across the top of the first member and overlies the cavity with the lid, the first member and the base member forming a stacked array. Inclined nozzle means carried by the pedestal functions to jet air from the pedestal top surface against the bottom of the chip to create an air film to support the chip and to impart a force laterally to move the chip against the cavity reference surface. Vacuum is then applied to secure the chips in said orientation, and the air supply is then removed.

BRIEF DESCRIPTION OF THE DRAWINGS

FIG. 4b is a top plan view of the portion of the linear device bank shown in FIG. 4a.

DESCRIPTION OF THE PREFERRED EMBODIMENT

Figure 4A:
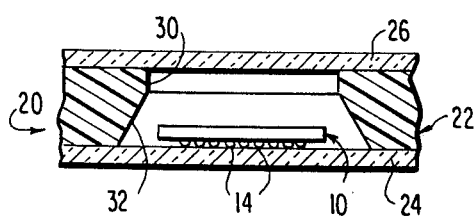
FIG 4a is a vertical sectional view similar to that of FIG. 3, with the linear device bank inverted.
Figure 4B:
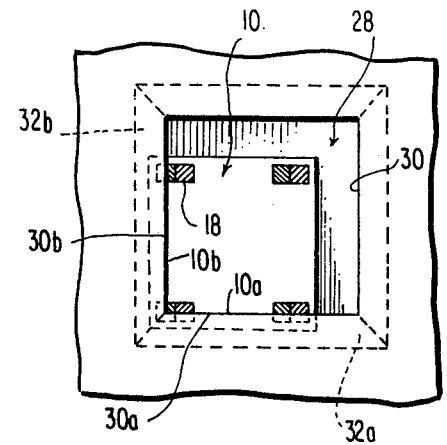
Figure 5:
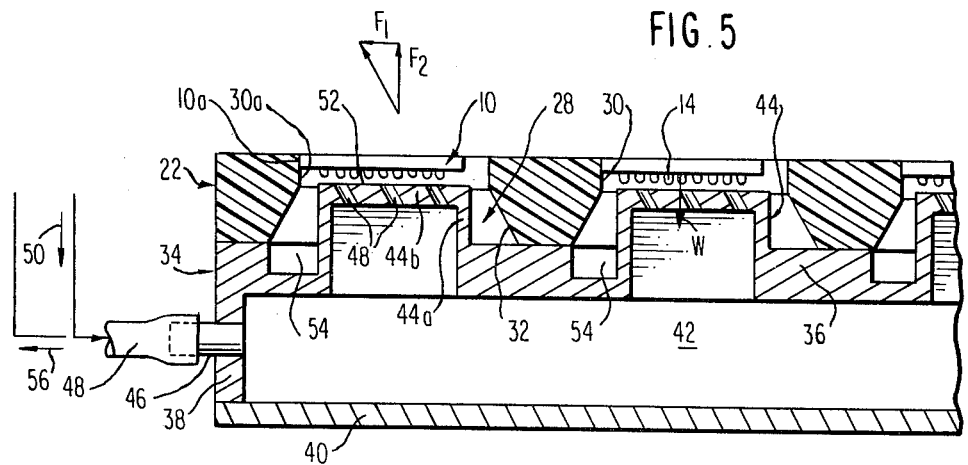
FIG. 5 is a vertical sectional view of a portion of a chip registration mechanism employed with elements of a linear device bank for simultaneous precise multiple chip registration of chips initially nested in the tray cavity of the linear device bank, forming a preferred embodiment of the present invention.
Figure 6:
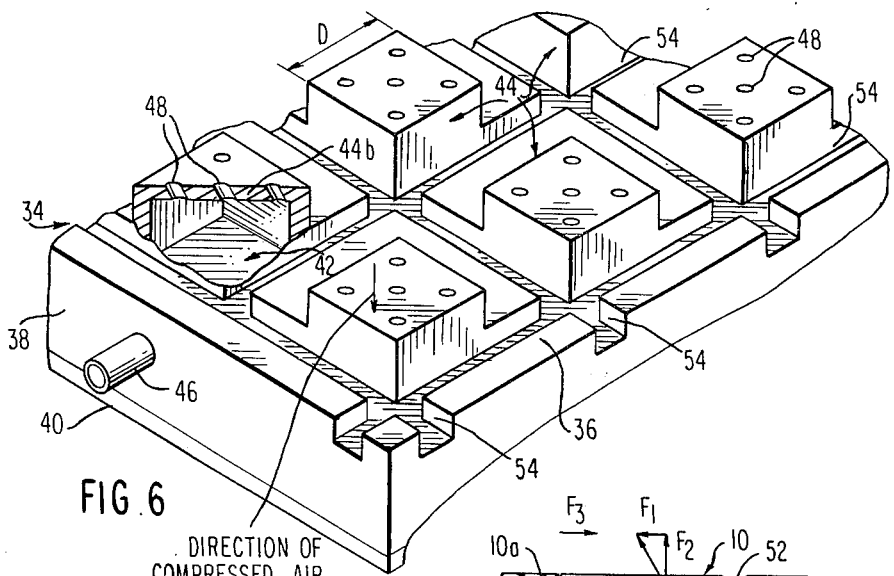
FIG. 6 is a perspective view, partially broken away of a portion of the chip registration mechanism illustrated in FIG. 5.

Referring to FIGS. 5, 6, 7, 8 and 9, the present invention is directed to the utilization of a chip registration mechanism (CRM) indicated generally at 34 which functions as a substitute for top cover 24 for the linear device bank 20 and which acts in conjunction with the bottom cover 26 and plastic tray 22 of linear device bank 20 (LDB) of FIG. 4a to provide the solution for the previously discussed problem. Like numerals are employed for like elements of the CRM and LDB. This assembly permits uniform, exact registration of the chips 10 within the individual cavities 28, to the accuracy required for successful reading, with respect to multiple registration surfaces of the tray 22 and maintains that precise registration after registration is effected. The chip registration mechanism 34 is comprised of a support plate 36, integrated to the rectangular vertical sidewalls 38, and a bottom cover 40, all of which define a plenum chamber as at 42. Integral with support plate 36 are a plurality of raised chip pads or pedestals indicated generally at 44; one pad for each cavity of the CRM 34 i.e., a total of 120 pads. The pedestals or pads 44 are formed by vertical walls 44a and a horizontal top wall 44b, the horizontal top wall 44b including a plurality of inclined nozzles or passages 48 which are oriented in the direction of one or more registration surfaces such as vertical sidewalls 30a, 30b of tray 22. The plenum chamber 42 interior of the chip registration mechanism 34 has compressed air supplied thereto through a fitting 46 via a flexible hose or tube 48 which receives compressed air from a source indicated generally by arrow 50.

The plenum chamber 42 also has vacuum supplied thereto through fitting 46 via a flexible hose or tube 48 which receives vacuum from a source indicated generally by arrow 56.

Each pad 44 is provided with one or more of the nozzles 48. Alternatively the nozzles are obliquely directed to a corner of cavity 28. Given nozzles within the pads could be inclined in right angle, different directions so as to orient the chip against two right angle vertical walls which intersect and essentially place the square chip 10 against a given corner of the square transverse cross-section cavity 28. Typically, the pads 44, support plate 36 and the plenum chamber sidewalls 38 are all fabricated from one piece of metal and the plenum chamber 42 is completed by the addition of the bottom cover 40 to the mechanism.

There are also dimensional relationships between the chip 10, the pad 44 and the straight and inclined sidewalls 30 and 32 of the plastic tray 22. Each chip pad 44, in plan view, is of square shape having sides of a dimension D which is less than the chip side dimension A and the cavity 28 dimension C (the distance between the straight sidewalls 30 defining that portion of cavity 28). Further, the vertical height of the pedestal or pad 44 is such that the exposed surface of top wall 44b of the chip pad or pedestal 44 is at the level of the intersection between the straight sidewalls 30 and the inclined sidewalls 32 defining cavity 28.

Figure 1A:
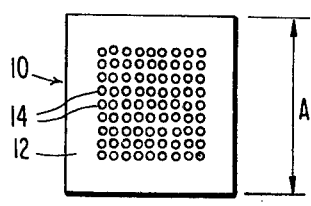
FIGS. 1a and 1b are top and bottom plan views, respectively, of an integrated circuit chip to which the invention has application.
Figure 1B:
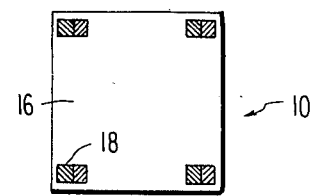
Figure 2:
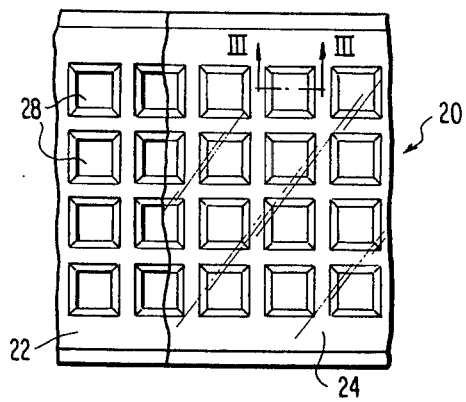
FIG. 2 is a top plan view of a portion of a linear device bank for transporting and inspecting a plurality of chips to which the present invention has application.
Figure 3:
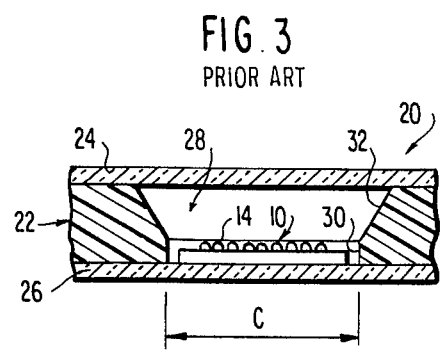
FIG. 3 is a vertical sectional view of one cell of the portion of linear device bank of FIG. 2, taken about line III—III.

In the employment of chip registration mechanisms (CRM) 34, the linear device bank 20 is oriented in the manner of FIG. 3. Top cover 24 is removed if provided, the chip registration mechanism 34 is positioned on tray 22 after inversion from the orientation shown in FIG. 5, that is, turned upside down with the chip pads 44 facing downwardly. Next, the tray 22, bottom cover 26 and the chip registration mechanism 34 as an assembly are flipped over. Finally the bottom cover 26 is removed so that the chips may be directly impinged with the laser spot (not shown) and read without the chance of distortion of the laser spot or its return beam which might be caused by inclusion of said bottom cover. The net relationship may be seen in FIG. 5. At this point, the chip 10 has been restored to the plane of the straight sidewalls 30 of the tray 22 and the front side 12 contact balls 14 initially rest on the upper surface 48 of pad 44.

Additionally, the chip pad 44 is centered relative to the cavity 28 defined principally by the linear device bank tray 22. When the plenum chamber 42 is pressurized by blowing compressed air through hose 48 from a source as per arrow 50, the compressed air exits from the plenum chamber 42 through the plurality of inclined nozzles 48 within each chip pad 44. The plenum chamber pressure is maintained at approximately two inches water. The air blown through each nozzle 48 reacts with the the chip front side 12 and the top surface 52 of the chip pad 44. This creates a driving force $F_1$ FIG. 5, which drives the chip 10 in the direction of the exiting air from the inclined nozzles 48. As indicated, force $F_1$ is the horizontal force component; additionally, the exiting air creates a vertical air bearing force $F_2$ which raises the chip above the surface 52 of the pedestal or pad 44. However, at this low air pressure, the vertical force component is sufficient to float the chip 10 slightly above surface 52 of the pedestal. The force $F_2$ is only slightly greater than the chip weight W.

As stated previously, the chip pad surface dimension D, is purposely designed to be less than the chip surface dimension A.

Figure 7:
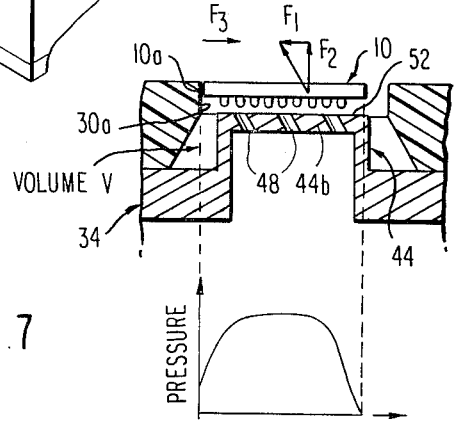
FIG. 7 is a pressure distribution plot for compressed air pressure along the surface of the chip in FIG. 5, absent relief channels included therein.

Referring to FIG. 7, it should be noted that unless steps are taken, the pressure profile about the chip does not go to zero at the banking edge 10a (10b) of the chip 10. This positively pressured air has no place to escape if the linear device bank cavity volume V is a closed volume. Therefore, this air tends to pass upwardly between the chip edge 10a (10b) and the cavity straight wall edge 30a (30b) defining the reference surface. This creates along the edge of the chip as seen by the pressure diagram to the left side, FIG. 7, a restoring force $F_3$ which opposes the horizontal driving force $F_1$. Thus, whenever the chip banking edge 10a (10b) comes in close proximity to the cavity straight wall edge 30a (30b), the restoring force $F_3$ overcomes the driving force $F_1$ and the chip is pushed away from the banking or reference registration surface 30a (30b). When the chip 10 is pushed sufficiently far away from the banking surface 30a (30b), force $F_1$ becomes greater than force $F_3$, and the chip once again is pushed towards the banking surface 30a (30b). A perpetual oscillatory effect may be created wherein the chip flutters within its cavity 28.

Under these circumstances, it is impossible to register the chip to the required tolerances or to read the chip serial number with the laser spot (not shown).

Figure 8:
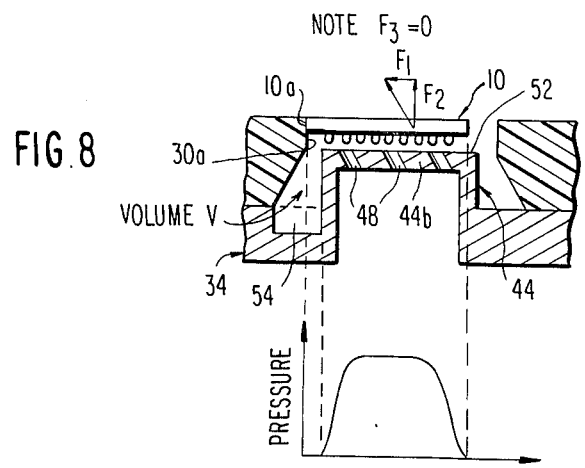
FIG. 8 is a pressure distribution plot for compressed air pressure along the surface of the chips in FIG. 5, with relief channels included therein.
Figure 9:
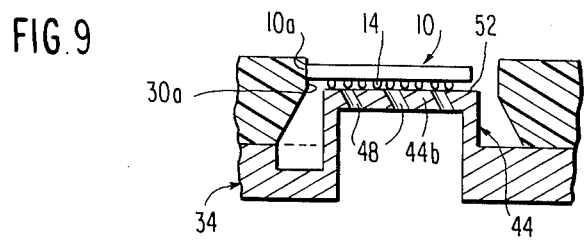
FIG. 9 is a vertical sectional view of one cell, shown generally in FIG. 5, after the chip has been accurately positioned as in FIG. 8, and vacuum applied to the plenum chamber.

Referring to FIG. 8, chip flutter is solved by the present invention by machining relief channels 54 into the chip registration mechanism support plate 36 and venting the channels 54 to the atmosphere at their ends, for instance. The pressure profile now drops to zero at the edge of the chip pad 44 because of this venting. The pressurized air vents to the atmosphere through the channels 54 rather than passing between the chip edge 10a (10b) and the chip banking surface 30a (30b). With no pressure profile along the chip edge 10a (10b), therefore, the restoring force $F_3$ drops to zero. The driving force $F_1$ now properly banks the chip against the banking surface 30a (30b) which occurs in two dimensions along XY axes of the cavity, as the banking surfaces are coincident, and there is no longer any vibration of the chip. When this orientation is achieved, vacuum supplied through hose 48 from a source as per arrow 56 is applied to the plenum concurrently with the compressed air supplied from a source as per arrow 50. The vacuum overrides the compressed air exiting from the plenum chamber 42 through the plurality of inclined nozzles 48 within each chip pad 44. The vacuum is maintained at approximately 20-25 inches Hg. This vacuum has the effect of securing the metal contact balls 14 and consequently the bottom of the chip 12 to the top of the pedestal 52 in the orientation previously described. After the chip is secured (i.e., chucked) in place, the compressed air 50 is removed. The chips are now properly accurately oriented and captivated, as shown in FIG. 9. The laser spot return beam from the chip now can be read by the serial number reader (not shown).

As may be appreciated, through the utilization of this invention, accurate registration of a chip 10 against one or more banking surfaces of the linear device bank cavity 28 is now possible. The chips 10 are capable of being registered and chucked for a variety of manufacturing process operations and bleed paths caused by the introduction of undercut channels in the chip registration mechanism 34 causes the pressure at the banking surface or surfaces of the chip and cavity to be reduced to zero, thereby eliminating chip flutter.

It is also obvious that while the invention has application to a linear device bank and is illustrated in conjunction with such bank, wherein 120 cavities function to permit and hold registration of a maximum of 120 chips, the structural features have application to a mechanism for properly registering and maintaining registration, once effected, of a single chip for a processing system, where accurate chip registration is required and must be maintained over time during a given manufacturing process.

A typical use would be in a chip electrical testing apparatus of a sort for either an in-process or final electric test for such devices, or for diagnostic testing of failed chips returned from customer field use.

While the invention has been particularly shown and described with reference to a preferred embodiment thereof, it will be understood by those skilled in the art that various changes in form and details may be made therein without departing from the spirit and scope of the invention.

What is claimed is

1. A carrier for retaining and positioning integrated circuit chips having identification codes on one surface thereof such that said chip code may be read, said carrier comprising:

a tray having multiple cells, each cell receiving an individual integration circuit chip, said cell defining a reference cavity oversized relative to said chip and having at least one reference surface, a chip registration base assembly, said base assembly comprising a support plate extending across said tray and underlying said cells, a plurality of individual pedestals projecting upwardly from said support plate within the cells, said pedestals having a transverse cross-section less than that of said cavity and said pedestals terminating in a flat top surface underlying and initially supporting said chip, a lid extending across said tray and overlying said cells to retain said chips when said lid, said tray and said chip registration base assembly are combined in that order to form a stacked array, and nozzle means carried by said pedestals for jetting air from the top surface of said pedestals against the bottoms of said chips of a pressure sufficient for supporting said chips on an air film and for imparting a transverse force to each chip to move an edge of the chip against said at least one cavity reference surface and for applying vacuum from the top surface of said pedestals against the bottoms of said chips sufficient to secure said chips in said orientation, wherein said tray comprises vertically spaced top and bottom walls, and wherein said cells comprise intersecting inclined sidewalls and straight sidewalls in order from said tray top wall to said tray bottom wall when said tray is positioned to initially receive said chips and wherein the transverse dimension between said cell straight sidewalls are in excess of the transverse dimensions of said chips received thereby, and wherein said lid underlies said tray and said lid and tray are inverted as an assembly to initially receive said chips, and wherein said chip registration base assembly is inverted and placed onto said tray such that the pedestals project into said tray cavities through said tapered sidewall portions of said cells after said chips are positioned within said cavities wherein the stacked assembly thus formed is further inverted prior to supplying air under pressure to said nozzle means, and wherein the height of the pedestals is approximately equal to the height of the tapered sidewall portions of said cells, such that air jetting against the bottom of said chips causes the tops of said chips to contact said lid while simultaneously an edge of said chip is positioned against a corresponding cell at least one reference surface and wherein vacuum applied from said nozzle means secures said chips in said orientation, and wherein said support plate includes recessed relief channels about said pedestal beneath said tray being open to the space between said pedestals and the tray cell sidewalls, and said carrier further comprises means for venting said relief channels to the atmosphere to prevent flutter of each said chip relative to said at least one reference surface during air jet application to the bottom of said chip by preventing air flow between the edge of the chip and said at least one reference surface.

2. A carrier for retaining and positioning integrated circuit chips having identification codes on one surface thereof such that said chip cod may be read, said carrier comprising:
a tray having multiple cells,
each cell receiving an individual integrated circuit chip,
said cell defining a reference cavity oversized relative to said chip and having at least one reference surface,
a chip registration base assembly, said base assembly comprising a support plate extending across said tray and underlying said cells,
a plurality of individual pedestals projecting upwardly from said support plate within the cells,
said pedestals having a transverse cross-section less than that of said cavity and said pedestals termination in a flat top surface underlying and initially supporting said chip,
a lid extending across said tray and overlying said cells to retain said chips when said lid, said tray and said chip registration base assembly are combined in that order to form a stacked array,
and nozzle means carried by said pedestals for jetting air from the top surface of said pedestals against the bottoms of said chips of a pressure sufficient for supporting said chips on an air film and for imparting a transverse force to each chip to move an edge of the chip against said at least one cavity reference surface and for applying vacuum from the top surface of said pedestals against the bottoms of said chips sufficient to secure said chips in said orientation, wherein said chips are of rectangular plan configuration, said cavities are rectangular in transverse cross-section and include two right angle straight walls forming co-incident reference surfaces, and wherein said nozzles are oriented such that compressed air blown through them exert forces on the bottom of said chips tending to cause two intersecting edges of said rectangular chip to engage intersecting reference surfaces defined by the straight sidewalls of said cavity and to thereby position one corner of the chip at a corner of the rectangular cavity and wherein vacuum applied through said nozzle means is sufficient to secure said chips in said orientation, wherein said tray comprises vertically spaced top and bottom walls, and wherein said cells comprise inclined sidewalls intersecting straight sidewalls in order from said tray top wall to said tray bottom wall when said tray is positioned to initially receive said chips and wherein the transverse dimensions between said cell straight sidewalls are in excess of the transverse dimensions of said chips received thereby, and wherein said lid underlies said lid and said lid and tray are inverted as an assembly to initially receive said chips, and wherein said chip registration base assembly is inverted and placed onto said tray such that the pedestals project into said cavities through said tapered sidewall portions of said cells after said chips are positioned within said cavities and the stacked assembly thus formed is further inverted prior to supplying air under pressure to said nozzle means and wherein the height of the pedestals is approximately equal to the height of the tapered sidewalls of said cells, such that air jetting against the bottom of said chips causes the tops of said chips to contact said lid while simultaneously an edge of each chip is positioned against a corresponding cell at least one reference surface and wherein vacuum applied from said nozzle means secures said chips in said orientation, and wherein said support plate includes recessed relief channels about said pedestal beneath said tray being open to the space between said pedestals and the tray cell sidewalls, and said carrier further comprises means for venting said relief channels to the atmosphere to prevent flutter of each chip relative to said at least one reference surface during air jet application to the bottom of said chip by preventing air flow between the edge of the chip and said at least one reference surface.

3. A carrier for retaining and positioning integrated circuit chips having identification codes on one surface thereof such that said chip code may be read, said carrier comprising:
a tray having multiple cells,
each cell receiving an individual integrated circuit chip,
said cell defining a reference cavity oversized relative to said chip and having at least one reference surface,
a chip registration base assembly, said base assembly comprising a support plate extending across said tray and underlying said cells,
a plurality of individual pedestals projecting upwardly from said support plate within the cells,
said pedestals having a transverse cross-section less than that of said cavity and said pedestals terminating in a flat top surface underlying and initially supporting said chip,
a lid extending across said tray and overlying said cells to retain said chips when said lid, said tray and said chip registration base assembly are combined in that order to form a stacked array,
a nozzle means carried by said pedestals for jetting air from the top surface of said pedestals against the bottoms of said chips of a pressure sufficient for supporting said chips on an air film and for imparting a transverse force to each chip to move an edge of the chip against said at least one cavity reference surface and for applying vacuum from the top surface of said pedestals against the bottoms of said chips sufficient to secure said chips in said orientation, wherein said chips are of rectangular plan configuration, said cavities are rectangular in transverse cross-section and include two right angle straight walls forming co-incident reference surfaces, and wherein said nozzles are oriented such that compressed air blown through them exert forces on the bottom of said chips tending to cause two intersecting edges of said rectangular chip to engage intersecting reference surface defined by the straight sidewalls of said cavity and to thereby position one corner of the chip at a corner of the rectangular cavity and wherein vacuum applied through said nozzle means is sufficient to secure said chips in said orientation, wherein said chip registration base assembly comprises sidewalls extending downwardly from said support plate and integral therewith, a bottom cover underlying said support plate and being spaced therefrom and defining with said support plate and said sidewalls, a plenum chamber, and wherein said pedestals comprise hollow projections integral with said support plate and being open to said plenum chamber and wherein said pedestals terminate in a horizontal, flat top wall underlying said chips, and wherein said nozzle means comprises perforations within said pedestal top walls and means for supplying air under pressure and/or vacuum to said plenum chamber, wherein said tray comprises vertically spaced top and bottom walls, and wherein said cells comprise tapered sidewalls intersecting straight sidewalls in order from said tray top to said tray bottom wall when said tray is positioned to initially receive said chips and wherein the transverse dimensions between said cell straight sidewalls are in excess to the transverse dimensions of said chips received thereby, and wherein said lid underlies said tray and said lid and tray are inverted as an assembly to initially receive said chips, and wherein said chip registration base assembly is inverted and placed onto said tray such that the pedestals project into said cavities through said tapered sidewalls of said cells after said chips are positioned within said cavities wherein the stacked assembly thus formed is further inverted prior to supplying air under pressure to said nozzle means, and wherein the height of the pedestals is approximately equal to the height of the tapered sidewall portions of said cells, such that air jetting against the bottom of said chips causes the tops of said chips to contact said lid while similtaneously the edge of each chip is positioned against a corresponding cell at least one reference surface and wherein vacuum applied through said nozzle means secures said chips in said orientation, and wherein said support plate includes recessed relief channels about said pedestals beneath said tray being open to the space between said pedestals and the tray cell sidewalls, and said carrier further comprises means for venting said relief channels to the atmosphere to prevent flutter of each chip relative to said at least one reference surface during air jet application to the bottom of said chip by preventing air flow between the edge of the chip and said at least one reference surface.

4. A chip registration mechanism for effecting exact registration of an integrated circuit chip relative to a fixed reference surface, so that said chip can be processed, said chip registration mechanism comprising:

a first member having a vertical axis reference cavity, said cavity having transverse dimensions oversized relative to said chip and defining at least one lateral reference surface, a chip registration base member underlying said first member bearing said reference cavity and including a pedestal projecting upwardly from said base member within said cavity and being sized transversely smaller than said cavity and terminating in a flat top surface underlying said chip, a lid extending across the top of said first member and overlying said cavity such that said lid, said first member and said base member form a stacked array, and inclined nozzle means carried by said pedestal for jetting air from said pedestal top surface against the bottom of said chip to create an air film to support said chip and to impart a force laterally against said chip to move the edge of said chip against said cavity reference surface and for applying vacuum from said nozzle means to secure said chip in said orientation, wherein said base member further comprises a relief channel about said pedestal being open to the sapce between said pedestal and said cavity wall, and said mechanism further includes means for venting said relief channel to the atmosphere to prevent chip flutter, insure immediate initiation of registration contact between the edge of said chip and said reference surface and the maintenance of said contact during continued application of the air jets against the bottom of said chip.

* * * * *